United States Patent [19]
Young et al.

[11] Patent Number: 5,801,634
[45] Date of Patent: Sep. 1, 1998

[54] SIGNAL TOWER CONTROLLER

[75] Inventors: Joseph R. Young; Benjamin Garcia Rodriguez; James R. Barry, all of San Antonio, Tex.

[73] Assignees: Sony Corporation, Tokyo, Japan; Sony Electronics Inc., Park Ridge, N.J.

[21] Appl. No.: 925,232

[22] Filed: Sep. 8, 1997

[51] Int. Cl.$^6$ .................................................. G08B 21/00
[52] U.S. Cl. .................. 340/635; 340/815.4; 118/715; 118/720
[58] Field of Search .................................. 340/634, 635, 340/815.4, 679, 680, 681; 118/715, 716, 719, 720; 414/217

[56] References Cited

U.S. PATENT DOCUMENTS

| | | | |
|---|---|---|---|
| 4,668,479 | 5/1987 | Manabe et al. | 422/186.5 |
| 5,153,841 | 10/1992 | Goff et al. | 363/478 |
| 5,446,450 | 8/1995 | Knutson | 340/635 |
| 5,690,744 | 11/1997 | Landau | 118/715 |
| 5,700,127 | 12/1997 | Harada et al. | 414/416 |

*Primary Examiner*—Thomas J. Mullen, Jr.
*Assistant Examiner*—Ashok Mannava
*Attorney, Agent, or Firm*—Wood, Herron & Evans, L.L.P.

[57] ABSTRACT

The invention provides an apparatus and method of monitoring a CVD process and providing an alarm signal normally used to terminate the CVD process in response to detecting the simultaneous occurrences of a command to initiate the CVD process, the initiation of the flow of a reactive process gas into the process chamber and the motion of a turret supporting the workpiece.

17 Claims, 2 Drawing Sheets

SIGNAL TOWER CONTROLLER

FIELD OF THE INVENTION

This invention relates to process monitors and more particularly, to an improved monitor for use with a deposition process.

BACKGROUND OF THE INVENTION

A deposition process, for example, a chemical vapor deposition w ("CVD") process is often used in the fabrication of semiconductor substrates or wafers. The CVD process is often provided by commercial CVD equipment, for example, the 8700 Series CVD equipment commercially available from Genus, Inc., of Sunnyvale, Calif. While the foregoing commercially available system provides many process monitoring features, it is often desirable that additional process states also be monitored. Therefore, often a separate monitor control, for example, a discrete component control or a programmable logic controller ("PLC") is interfaced with the CVD process equipment to provide process state indications in the form of various combinations of visual, i.e., colored lamp, displays and/or audible alarms. An example of a separate monitor control is disclosed in U.S. Pat. No. 5,446,450 issued on Aug. 29, 1995 for Genus Tower Light Controller, which patent is owned by the assignee of the present invention. That patent discloses a discrete hardware controller which is responsive to signals from the CVD process equipment and illuminates different combinations of red, yellow, and green indicator lights in response to different operating states of the CVD process equipment. Thus, the patent discloses a monitor control that provides additional information to an operator with respect to the process status of the equipment. Normally, the indicator lamps are on a light tower above the process equipment so that they are visible from locations remote from the equipment. Thus, activity associated with the deposition process can be monitored on a more timely basis to permit corrective action of impending and/or current error conditions.

While the above described equipment has proven effective, its monitoring capabilities are limited to the handling of workpieces, for example, semiconductor substrates or wafers, prior to and after the execution of the CVD process per se. For example, the system actively monitors the transfer of wafers from a pair of cassettes to the processing chamber and the unloading of the processed wafers from the chamber back to their respective cassettes. The system also monitors the atmospheric and partial vacuum pressure states within system components. Overall process efficiency is improved, and wafer scrap or waste is reduced by the improved monitoring system.

However, the above monitoring system provides no additional monitoring of the CVD process itself. While the CVD process equipment provides some process monitoring, there are unmonitored process parameters that are subject to changes that may be detrimental to the quality of the CVD process. For example, during the CVD process, semiconductor wafers are mounted in a generally vertical orientation on a face of a chuck attached to a rotatable turret. Each chuck face and wafer are positioned to be directly in front of and generally parallel to the face of a puck-shaped gas dispersion plate from which the CVD gases are dispensed. As long as the semiconductor wafer remains parallel, that is, generally equally distant over its entire surface, from the dispersion plate, the gases flowing from the plate will result in the deposition of a film on the semiconductor wafer having a relatively constant and uniform film thickness. If, however, the turret does not remain fixed in its position, but experiences a small rotation, the surface of the semiconductor wafer is no longer equidistant over its entire surface from the dispersion plate, that is, the wafer is skewed relative to the plate. In that skewed, nonparallel position, the portion of the wafer closer to the gas dispersion plate will experience a deposition of film having a greater thickness than the portion of the semiconductor wafer that is further from the plate. Thus, any small angular deviation of the turret supporting the semiconductor wafers from its proper angular orientation required for processing will result in the nonuniform deposition of film that requires the wafer be scrapped. A failure to detect such a turret angular deviation during the CVD process will result in significantly reduced yield from the CVD process. Thus, there is a need to provide a monitoring system that improves the monitoring of the CVD equipment during the implementation of the CVD process.

SUMMARY OF THE INVENTION

The present invention provides a monitoring system that permits the early detection of an error condition that most probably will result in a batch of wafers that are out of specification and must be scrapped. The present invention further improves the efficiency of the CVD processing system by immediately identifying an error condition in the CVD chamber that will produce out-of-spec wafers and immediately thereafter, terminating the CVD process. The CVD process can then be restarted with a new batch of wafers. Thus, the present invention provides a significant advantage and benefit in being able to detect those out-of-spec wafers prior to their being processed further and eventually found to be defective. The invention is especially useful in those production environments in which test wafers are run on a periodic basis, and wafers produced between test wafer batches are presumed to be within specification.

According to the principles of the present invention and in accordance with the preferred embodiments, a monitor for a CVD process in which a workpiece is supported on a movable chuck within a CVD chamber includes a first state switch operating in response to an initiation of the CVD process within the CVD chamber. The monitor further includes a second state switch operating in response an initiation of a flow of a reactive process gas into the CVD chamber and a third state switch operating in response to detecting motion of the chuck. The monitor provides an alarm signal in response to the operation of the first, second and third state switches, whereby the alarm signal is produced upon detecting the simultaneous occurrences of the initiation of the CVD process, the initiation of the flow of the reactive process gas into the CVD chamber and motion of the chuck.

In another embodiment of the invention, the invention provides a method of monitoring a CVD process and providing an alarm signal in response to detecting the simultaneous occurrences of a command to initiate the CVD process, the initiation of the flow of a reactive process gas and the motion of the chuck.

These and other objects and advantages of the present invention will become more readily apparent during the following detailed description taken in conjunction with the drawings herein.

DETAILED DESCRIPTION OF THE INVENTION

Figure 1:
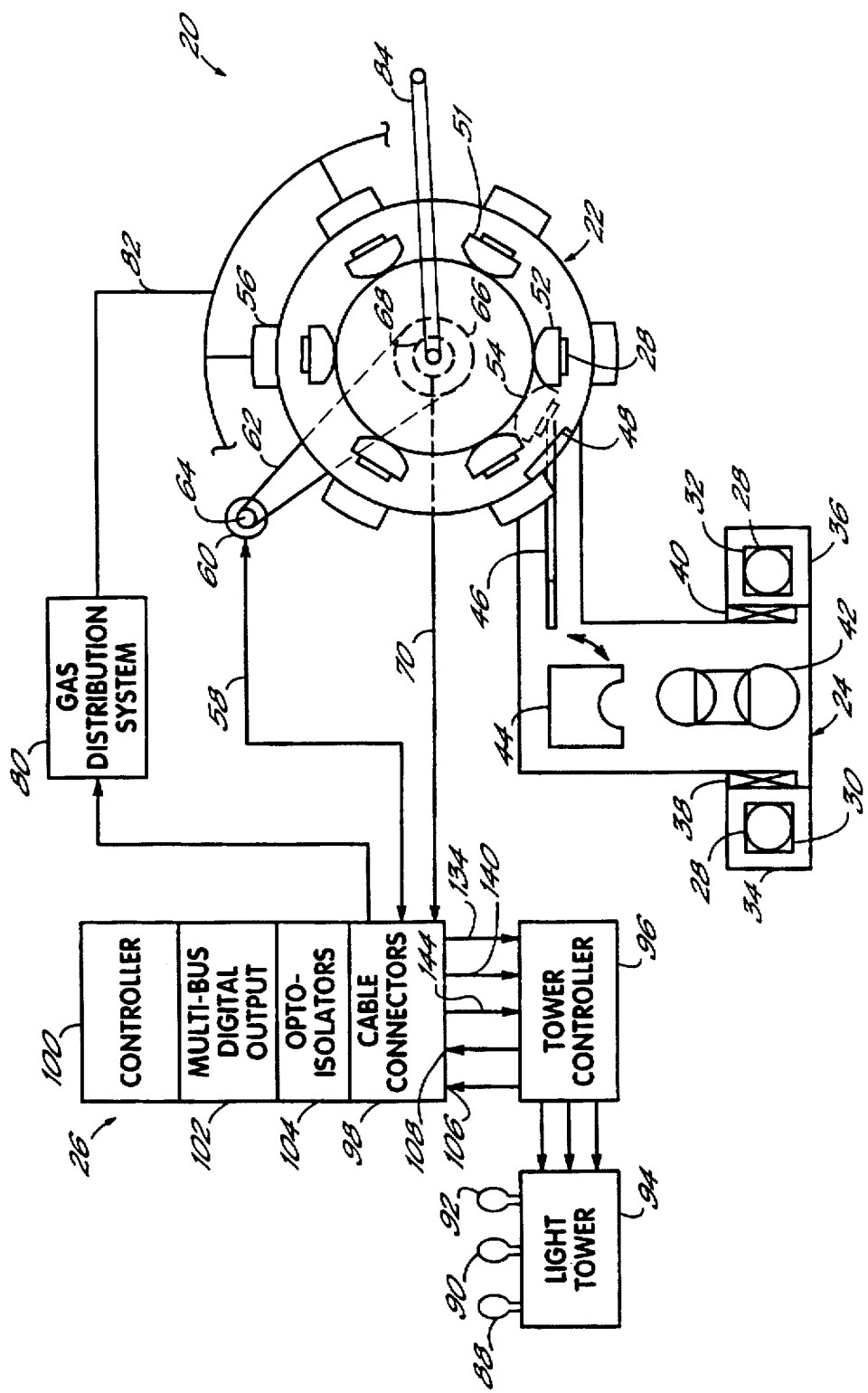
FIG. 1 is an overall black diagram illustrating a deposition system in accordance with the principles of the present invention.

Referring to FIG. 1, a deposition system 20, for example, a Genus 8700 Series CVD system, includes an isolated deposition or processing chamber 22, a wafer transport chamber 24 and a system control 26. Wafers 28 are stored in stacks in left and right cassettes 30, 32 that are loaded into respective left and right continuous feed load locks 34, 36. Thereafter, isolation valves 38, 40 are opened, and the load locks 34, 36 are evacuated to the desired pressure, for example, 200 millitorr. A wafer transfer arm 42 removes a wafer from one of the stacks, for example, cassette 30, and transfers the wafer to a plate 44. The plate 44 rotates 90 degrees, and the wafer is removed therefrom by a robot load arm 46. The load arm 46 extends through a process chamber door 48 and along a path illustrated in phantom until the wafer is positioned adjacent a hot chuck 52 mounted on a rotatable turret 54 that has been rotated to position the chuck 52 at a wafer handling or loading position (shown in phantom). The hot chuck 52 has wafer support pins (not shown) in an outwardly directed face 51. The wafer is transferred from the load arm 46 to the pins on the hot chuck 52, and the robot arm 46 returns to its initial position within the wafer transport chamber 24. The loading cycle is repeated for each of the chucks 52 on the rotatable turret 54. To begin a deposition process, the turret 54 supporting the chucks 52 is rotated to the illustrated process or face position where each chuck face 51 is directly opposite and preferably equidistant from a respective stationary gas dispersion plate 56.

The turret is rotated by command signals provided over a signal line 58 to a motor 60, for example, a stepping motor. A drive belt 62 extends around output shaft 64 of the motor 60 and a pulley 66 connected to the turret 54. Thus, the system control 26 commands a rotation of the turret 54 to precisely locate the faces 51 of respective hot chucks 52 with respect to the dispersion plates 56. An encoder 68 is also connected to the turret 54 and provides feedback signals on line 70 to the system control at 26 that represent increments of rotation of the turret 54.

When the faces 51 of the chucks 52 are properly located in front of the dispersion plates 56, the deposition process may be initiated. First, the processing chamber 22 is evacuated to a desired pressure. Next, the system control 26 commands a gas distribution system 80 to initiate the flow of reactive process gases through gas lines 82 and each of the dispersion plates 56. The reactive gases may, for example, be silane, $SiH_4$ and tungsten hexaflouride, $WF_6$. Those reactive gases are mixed with an inert process gas, for example, argon. The process gases within the chamber 22 are exhausted by an exhaust system 84. At the end of the CVD process, the chucks 52 are rotated back to the load position 54 shown in phantom, and the arm 46 is used to remove the processed wafers from the pins 50 and back into the wafer transport chamber 52. The wafers then are loaded by wafer transfer arm 42 back into the cassettes 30, 32.

While the system control 26 contains many indicators of process conditions, as described with respect to U.S. Pat. No. 5,446,450, additional states associated with the loading and unloading of the wafers 28, may be monitored by red, yellow, and green indicator lights 88, 90, 92 mounted on a light tower 94. The indicator lights 88–92 are controlled by a tower controller 96, for example, a model SLC-100 programmable logic controller ("PLC") commercially available from Allen Bradley of Milwaukee, Wis. The tower controller 96 is connected by wires or cables to cable connectors on termination board 98 within the system control 26. The operating states of the deposition system 20 are initiated by a controller 100 which provides digital output signals on a multibus 102. The digital output signals are isolated utilizing known optoisolators 104, and the optoisolators 104 are connected to the appropriate pins of the cable connectors on the termination board 98.

While the light tower 94 and the associated tower controller 96 have been used to monitor states of wafer handling both before and after the CVD process, there has been no supplemental monitoring of the CVD process itself, over that provided by the system control 26. However, through use of the deposition system 20, it was discovered that certain conditions within the processing chamber 22 may randomly and unpredictably occur which adversely affect the quality of the deposition process. For example, it was discovered that the turret 54 may experience a slight but harmful rotation from its desired process or face position. It is possible that a noise spike, for example, an RF noise spike, may cause the motor 60 to experience an uncommanded, that is, undesired, rotation that will cause the turret 54 to also rotate. As will be appreciated, other extraneous conditions may also result in uncommanded incremental turret rotation. That motion will cause the faces 51 of the chucks 52 to move to an undesired, non-parallel and non-equidistant relationship with respect to their respective dispersion plates 56. The non-parallel relationship between the faces 51 and the dispersion plate 56 will result in the deposition of a film on the wafers 28 that varies in thickness across the wafer surface and may result in the wafer being unacceptable and scrapped. Further, if the spurious rotation of the turret 54 is detected prior to the initiation of the deposition process, the wafers in the processing chamber 22 at that time can be saved. The system control 26 can be used to move the turret 54 back to the face position such that the faces of 51 are properly aligned and positioned with respect to their respective dispersion plates 56. After that, the CVD process may be initiated.

The system control 26 provides the capability for the user to create a command signal terminating or aborting the CVD process. For example, referring to FIGS. 1 and 2, the system control 26 provides terminals 106, 108 which, if its connected together, permit the CVD process to continue. If, however, continuity is broken between terminals 106 and 108, the system control 26 immediately terminates or aborts the CVD process. Conditions under which the CVD process is terminated would include detecting that the reactive gases are no longer flowing, detecting a loss of power or a malfunction of the power supplies, detecting a loss of the desired pressure within the processing chamber, detecting a malfunction in the exhaust gas, vacuum pump, etc. Thus, any of those conditions would result in the circuit between terminals 106 and 108 opening, thereby providing a command to the system control 26 to terminate the CVD process.

Figure 2:
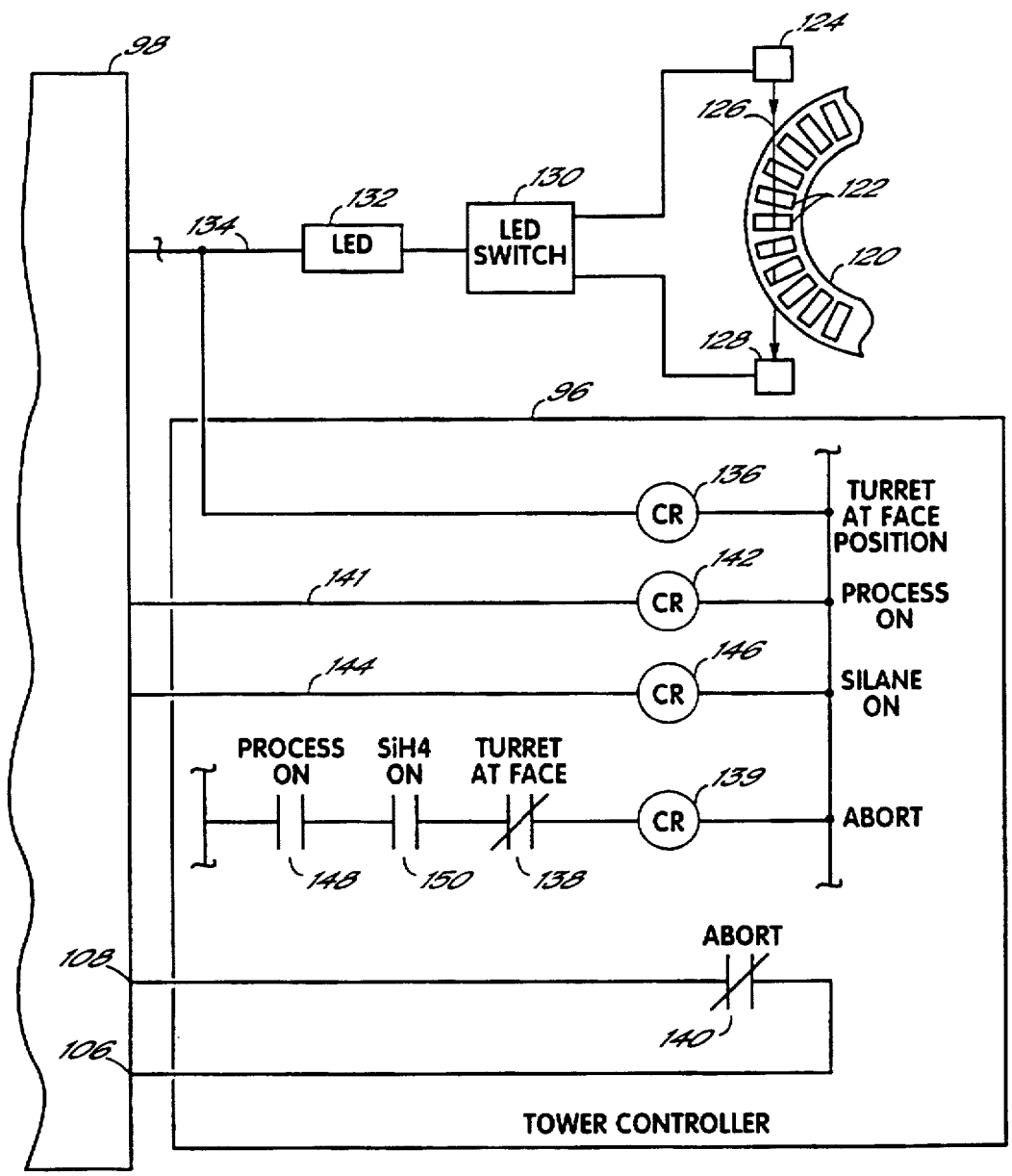
FIG. 2 is a partial block and schematic diagram of a portion of the system illustrated in FIG. 1.

Referring to FIG. 2, an encoder strip or ring 120, is connected to and rotates with the turret 54. The encoder strip contains a row of holes 122 through which light can pass. When the turret of 54 is in a desired position, for example, the face position illustrated in FIG. 1, a beam of light 126, produced from fiberoptic emitter 124, passes through one of the holes 122 and is received by a fiberoptic receiver 128. When the fiberoptic receiver 128 receives light, an LED switch 130 closes to illuminate the LED 132 and drive the signal line to a known potential, for example, ground. A voltage drop is then created across the turret-at-face-position coil 136, thereby opening the turret-at-face-position normally closed contacts 138. With the contacts 138 in the open state, the abort coil 139 remains de-energized; and the normally closed abort contacts 140 remain closed.

The present invention is only concerned with turret motion during the CVD process. Therefore, it is important that the turret-at-face contacts 138 only be monitored during the deposition process, that is, when the process is ON and the reactive process gas, for example, silane is flowing. The process ON state is monitored from a first signal provided by the system control 26 and received on line 141 connected between the termination board 98 and coil 142. Similarly, a silane ON state signal is provided from the termination board 98 on line 144 to relay coil 146. When the system control determines that the process and the silane are ON, the signals on lines 141, 144 pick up the coils 142, 146, respectively, and close respective normally open contacts 148, 150. With the contacts 148, 150 closed, the coil 139 will then respond to the state of the normally closed contacts 138. As long as the turret 54 remains in the desired or face position, and the fiberoptic receiver 128 receives the light from the fiberoptic emitter 124 through one of the holes 122, the LED switch 130 remains closed; and line 134 remains at a ground potential. Thus, coil 136 remains energized, and its normally closed contact 138 remain open. Further, the normally closed contacts 140 connecting terminals 106, 108 remain closed, thereby not interrupting the CVD process.

If, for any reason, the turret 54 experiences a slight rotation and the encoder strip 120 moves to the extent that the fiberoptic receiver 128 no longer receives light through the holes 122; the LED switch 130 will open; the LED 132 will turn OFF; and the line 134 wall switch from ground potential such that there is no voltage drop across the turret-at-face-position relay 136. Thus, the relay 136 is de-energized, and its normally closed contact 138 closes, thereby energizing the coil 139 and opening its normally closed contacts 140. Opening the contacts 140 breaks the continuity between terminals 106 and 108 and generates an alarm or interrupt signal to the system control 26, commanding the control 26 to terminate or abort the CVD process.

In use, cassettes 30, 32, each containing 25 wafers 28, are loaded into the load locks 34, 36. The operator then presses a start or process ON button to initiate operation of the CVD system. The process ON push button results in a process ON state signal on line 141 (FIG. 2), which picks up coil 142 and closes the contacts 148. Thus, the present invention is not operative in the manual, maintenance, or other operating modes of the CVD equipment. While six wafers from one of the cassettes are being loaded on to the six chucks 52 within the processing chamber 22, the inert process gas argon is also being supplied by the gas distribution system 80 to the processing chamber 22. After the wafer loading process is complete, the turret 54 rotates to the face position where the chucks 52 are directly in front of respective gas dispersion plates 56; and thereafter, the gas distribution system 80 initiates the flow of the reactive gases to the processing chamber. Initiation of the silane reactive gas flow provides a second state signal on line 144 which energizes relay 146 and closes contacts 150. If, thereafter, the turret 54 and associated encoder strip 120 experiences a rotation of sufficient magnitude to interrupt the beam of light 126 being received by the LED receiver 128, the signal line 134 changes state, thereby providing a third state signal which de-energizes the relay 136 and closes contacts 138. The relay coil 139 is energized to open the normally closed contacts 140, thereby providing an alarm or abort signal to the system control 26. Thus, the relay coils 136, 142, 146 and their respective contacts 148, 150, 138 function as state switches to provide an alarm signal in response to detecting the simultaneous occurrences of the initiation of the CVD process, the initiation of reactive gas flow into the CVD chamber 22, and motion of the wafer 28, a respective chuck 52 and turret 54. Further, relays 136, 142, 146, and 139 and their respective contacts 148, 150, 138, 140 can also be considered to be functioning as a logical AND gate, that is, the alarm or abort signal is produced in response to the simultaneous occurrences of first, second, and third signals represented by changes of state on respective lines 134, 141, and 144.

If motion of the turret is detected after initiation of the flow of reactive gases, but prior to any deposition taking place, the turret 54 can be repositioned and realigned, and the process restarted without having to destroy or scrap the wafers that are currently in the chucks 52. More frequently, however, movement of the turret will be detected after the deposition process has started, and in that situation, the wafers currently in the processing chamber 22 cannot be used and must be scrapped. Normally, in a production process, not every wafer is tested as it leaves the CVD chamber. Generally, the wafer system is checked for proper operation by test wafers that are manufactured on a periodic basis. Further, the wafers produced during cycles between the test wafers are presumed to be within the desired specifications. However, if in different processing batches, the turret randomly moves or rotates a small amount, the wafers produced during that cycle, although presumed to be within specification, will most probably be improperly manufactured and out of specification.

Thus, by detecting a small rotation of the turret 54 during the CVD process, the present invention permits the identification of a batch of wafers that are most probably out of specification, but that would otherwise be considered within the specification. Thus, the present invention provides a significant advantage and benefit in being able to detect out of specification wafers prior to their being processed further and eventually being found to be defective. The present invention further improves the efficiency of the processing chamber by identifying the occurrence of an error in the CVD processing chamber that will produce out-of-spec wafers, thereby enabling the cycle to be immediately terminated. The faulty wafers can then be removed and scrapped and the process re-initiated using a new batch of wafers.

While the invention has been illustrated by the description of one embodiment and while the embodiment has been described in considerable detail, there is no intention to restrict nor in any way limit the scope of the appended claims to such detail. Additional advantages and modifications will readily appear to those who are skilled in the art. For example, the disclosed embodiment provides a state signal on line 144 in response to the initiation of the flow of the silane reactive gas. As will be appreciated, the state signal on line 44 could alternatively be created by the detecting the initiation of the flow of other reactive gases, for example, tungsten hexaflouride. While normally the alarm signal provided by energizing the abort relay 139 is used to terminate the CVD process, alternatively, the alarm signal may be used to provide another indication of a system problem. For example, the alarm signal may also be used to provide an error indicator by illuminating a combination of the tower lights 88-92 or providing an audible alarm. Any visual or audible alarm may be used in combination with or instead of the action of terminating the CVD process.

While the above description relates to a CVD process, the described invention is applicable to any deposition process in which a workpiece is supported on a movable chuck or turret. Therefore, the invention in its broadest aspects is not limited to the specific details shown and described. Consequently, departures may be made from the details described herein without departing from the spirit and scope of the claims which follow.

What is claimed is:

1. An apparatus for monitoring a deposition process in which a workpiece is supported on a movable chuck within a deposition chamber, the apparatus comprising:
   a first state switch operating in response to an initiation of the deposition process within the deposition chamber;
   a second state switch operating in response an initiation of a flow of a reactive process gas into the deposition chamber;
   a third state switch operating in response to detecting motion of the chuck; and
   providing an alarm signal in response to the operation of the first, second and third state switches, whereby the alarm signal is produced upon detecting the simultaneous occurrences of the initiation of the deposition process, the initiation of the flow of the reactive process gas into the deposition chamber and, motion of the chuck.

2. The apparatus of claim 1 wherein the second state switch operates in response to the flow of one of silane and tungsten hexaflouride into the deposition chamber.

3. The apparatus of claim 1 wherein the chuck is movable to a processing position and the third state switch operates in response to detecting motion of the chuck away from the processing position.

4. The apparatus of claim 1 wherein the alarm signal is produced in response to the first, second and third state switches closing.

5. An apparatus for monitoring a deposition process in which a workpiece is supported on a movable chuck within a deposition chamber, the apparatus comprising an AND gate providing an output having a first state in response to
   a first input having the first state in response to an initiation of the deposition process within the deposition chamber;
   a second input having the first state in response to an initiation of a flow of a reactive process gas into the deposition chamber;
   a third input having the first state in response to detecting motion of the chuck, whereby the first state of the output is produced upon detecting the simultaneous occurrences of the initiation of the deposition process, the initiation of the flow of the reactive process gas into the deposition chamber and, motion of the chuck.

6. A method for monitoring a deposition process in which a workpiece is supported on a movable chuck within a deposition chamber, the method comprising the steps of:
   detecting a command to initiate a deposition process within the deposition chamber;
   detecting the initiation of the flow of a reactive process gas into the deposition chamber;
   detecting motion of the chuck away from the processing position; and
   providing an alarm signal in response to detecting the simultaneous occurrences of the command to initiate the process, the initiation of the flow of the reactive process gas and, the motion of the chuck.

7. The method of claim 6 further comprising the step of producing in response to the alarm signal a visual indicator representing motion of the chuck during the deposition process.

8. The method of claim 7 further comprising the step of producing in response to the alarm signal an aural alarm representing motion of the chuck during the deposition process.

9. The method of claim 6 further comprising the step of terminating the deposition process in response to detecting the alarm signal.

10. A method for monitoring a deposition process in which a workpiece is supported on a movable chuck within a deposition chamber, the method comprising the steps of:
    producing a first signal in response to an initiation of the deposition process within the deposition chamber;
    producing a second signal in response to an initiation of a flow of a reactive process gas into the deposition chamber;
    producing a third signal in response to detecting motion of the chuck; and
    providing an alarm signal in response to the simultaneous occurrences of the first, second and third signals, whereby an alarm is produced upon detecting the simultaneous occurrences of the initiation of the deposition process, the initiation of the flow of the reactive process gas into the deposition chamber and, the motion of the chuck.

11. A method for monitoring a deposition process in which a workpiece is supported on a chuck within a deposition chamber, the method comprising the steps of:
    detecting a command to initiate a deposition process within the deposition chamber;
    detecting initiation of a flow of a reactive process gas into the deposition chamber;
    detecting motion of the chuck; and
    providing a signal to terminate the deposition process in response to detecting the simultaneous occurrences of the command to initiate the process, the initiation of the flow of the reactive process gas and, the motion of the chuck.

12. The method of claim 11 wherein the method further comprises detecting a flow of a reactive gas into the deposition chamber.

13. The method of claim 11 wherein the method further comprises detecting a flow of one of $SiH_4$ gas and $WF_6$ into the deposition chamber.

14. The method of claim 11 wherein the chuck is movable to a processing position and the method further comprises detecting motion of the chuck away from the processing position.

15. The method of claim 11 wherein a plurality of workpieces are supported on a plurality of chucks attached to a rotatable turret and the method further comprises detecting rotation of the turret.

16. The method of claim 15 wherein the turret rotates to move the chucks between a handling position and the processing position and wherein the method further comprises detecting rotation of the turret from the processing position.

17. A method for monitoring a deposition process in which workpieces are supported on chucks within a deposition chamber, the chucks being mounted on a turret rotatable to a processing position, the method comprising the steps of:
    closing first contacts in response to a command to initiate a deposition process within the deposition chamber;
    closing second contacts in series with the first contacts in response to detecting initiation of a flow of a reactive process gas into the deposition chamber;

closing third contacts in series with the first and second contacts in response to the turret being in the processing position;

opening the third contacts in response to the turret moving from the processing position; and providing an alarm signal in response to the first and second contacts being closed and the third contacts opening.

* * * * *